United States Patent [19]
Numada

[11] Patent Number: 5,406,119
[45] Date of Patent: Apr. 11, 1995

[54] LEAD FRAME

[75] Inventor: Toru Numada, Tokyo, Japan

[73] Assignee: NEC Corporation, Japan

[21] Appl. No.: 859,655

[22] Filed: Mar. 30, 1992

[30] Foreign Application Priority Data

Mar. 28, 1991 [JP] Japan .................. 3-064249

[51] Int. Cl.[6] .......................................... H01L 23/48
[52] U.S. Cl. ..................................... 257/692; 257/772
[58] Field of Search ............................. 257/692, 772

[56] References Cited

U.S. PATENT DOCUMENTS 4,722,060 1/1988 Quinn et al. .................. 257/672

FOREIGN PATENT DOCUMENTS 212861 1/1990 Japan .
3104148 5/1991 Japan .

Primary Examiner—Rolf Hille
Assistant Examiner—Roy Potter
Attorney, Agent, or Firm—Laff, Whitesel, Conte & Saret, Ltd.

[57] ABSTRACT

A lead frame includes outer leads each having a thinner portion made by coining, for example, so that a prefabricated tip is formed thereat before the soldering process by cutting the thinner portion. The prefabricated tip is coated with the solder at the soldering stage. Therefore, it is easy to provide stable and reliable connections of leads thus formed to pads of a printed circuit board to mount a semiconductor device having the leads on the printed circuit board.

3 Claims, 3 Drawing Sheets

LEAD FRAME

FIELD OF THE INVENTION

This invention relates to a lead frame, and more particularly to, a lead frame used for a semiconductor device.

BACKGROUND OF THE INVENTION

A semiconductor device includes a pellet into which a semiconductor chip having integrated circuits (ICs) is divided. Such a pellet is mounted on an island of a lead frame. The lead frame has a plurality of leads each having inner and outer leads. The lead frame with the pellet is encapsulated in molding resin except the outer leads.

A conventional lead frame is formed on a metal strip such as plate, sheet, etc. by punching or etching tile metal strip to have predetermined patterns. In general, a plurality of the lead frames are formed simultaneously on one metal strip. The conventional lead frame includes an island on which a pellet is to be mounted, and a plurality of leads are arranged surrounding the island. As explained above, each lead is composed of inner and outer leads which are integral to each other. Each inner lead is extended near the island. On the other hand, tile outer leads are integral with the frame member to be separated therefrom.

The conventional lead frames are soldered on both surface to have a solder layer, and is separated from the frame member by cutting the outer leads at predetermined points.

According to the conventional lead frame, however, there is a disadvantage in that it is difficult to provide stable and reliable connections of a semiconductor device on pads of a printed circuit board, because cross-sectional surfaces of the outer leads which are cut to provide predetermined configuration and length of leads have no solder layer thereon.

SUMMARY OF THE INVENTION

Accordingly, it is an object of the invention to provide a lead frame from which tips of outer leads are coated with solder layers are obtained to provide stable and reliable connections of a semiconductor device on pads of a printed circuit board.

According to a feature of the invention, a lead frame comprises:

an island on which a pellet is to be mounted;
plurality of inner leads arranged around the island, and each having a tip locating near the island with a predetermined distance; and
a plurality of outer leads each continuously extending from a corresponding lead of the plurality of inner leads;
wherein each of the plurality of outer leads has a prefabricated tip which is formed before being dipped into solder solution.

BRIEF DESCRIPTION OF THE DRAWINGS

The invention will be explained in more detail in conjunction with appended drawings wherein.

DESCRIPTION OF THE PREFERRED EMBODIMENTS

Before describing a lead frame in preferred embodiments according to the invention, the conventional lead frame described before will be explained.

Figure 1A:
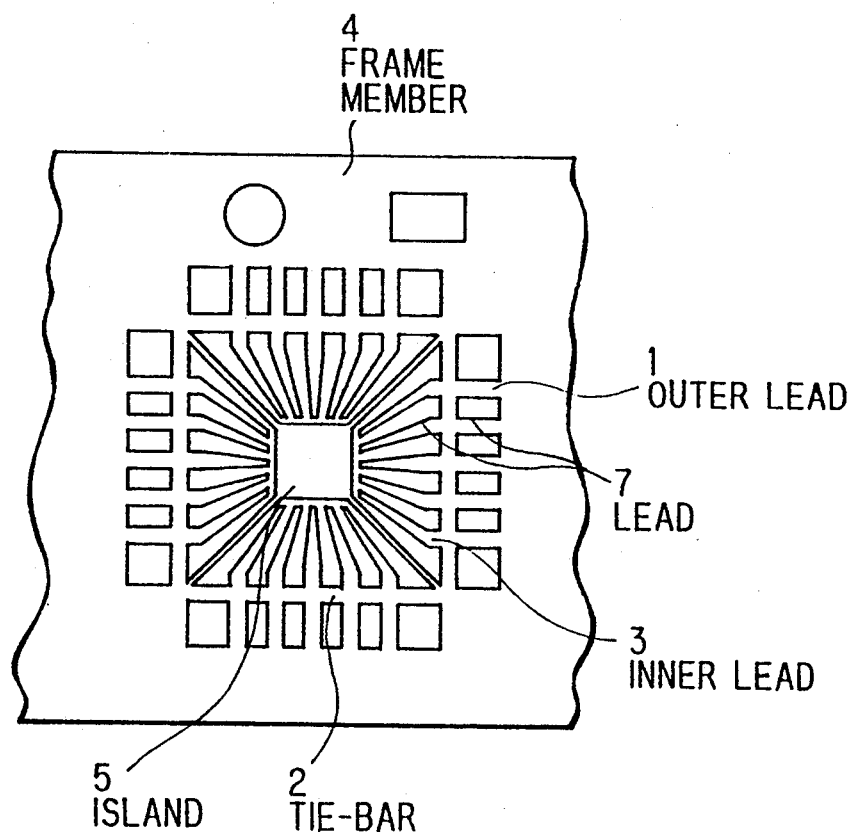
FIGS. 1A and 1B are a partial plan view and a partial cross-sectional view illustrating a conventional lead frame, respectively.

As shown in FIG. 1A, the conventional lead frame includes an island on which a pellet is to be mounted. A plurality of leads 7 are provided surrounding the island 5. Each 1 lead 7 is composed of inner and outer leads 1 and 3 at a boundary point of which a tie-bar 2 is provided. Tile tie-bars 2 which bridge the neighboring leads 7 are provided for blocking the pressured molding resin from flowing tile inner to outer leads in the molding process. Each inner lead 3 has an edge extended near the island 3. The outer leads 1 are integrated with a frame member to be separated from the frame member 4. Usually, plurality of lead frames, that is three to eight for example, are fabricated on a metal plate such as 42-alloy or copper having a thickness of approximately 0.15 to 0.2 mm.

Figure 1B:
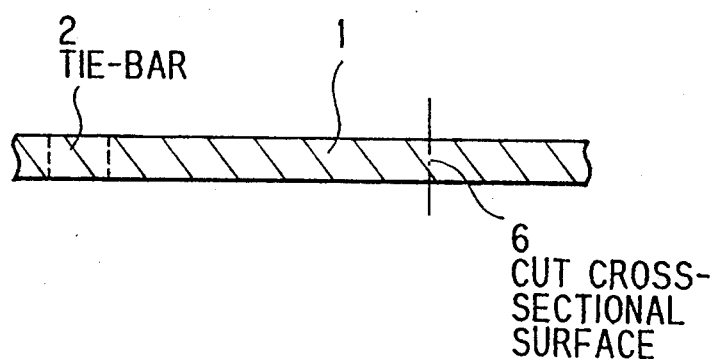

A tip edge of each of the inner leads does not touch but locate near the island with a distance of approximately 2 to 3 mm. Pads of the IC fabricated in the pellet and the edges of the inner leads 3 are connected by bonding wires consisting of a conductive metal such as aluminum or gold having a diameter of approximately 30 μm for connecting the IC electrically with external circuits through the inner and outer leads 3 and As shown in FIG. 1B, each outer lead 1 is to be cut at a line 6 to provide a predetermined length of lead after being dipped in solder, so that a cut cross-sectional surface 6 of the outer lead 1 will be exposed without any solder layer. Therefore, it is difficult to provide stable and reliable connections of leads thus formed to pads of a printed circuit board to mount a semiconductor device having the leads on the printed circuit board.

Figure 2:
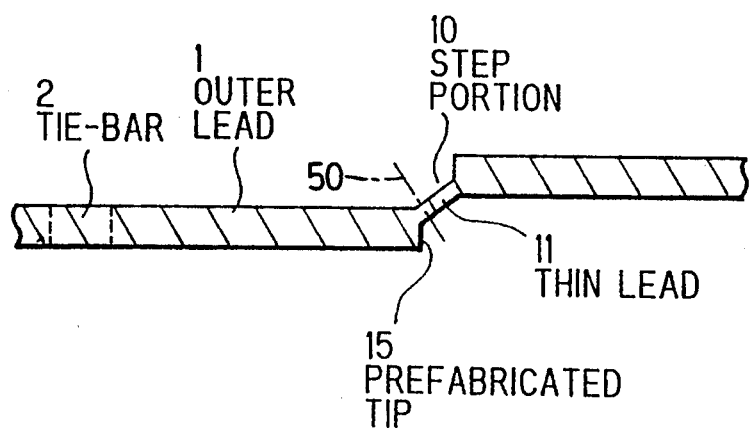
FIG. 2 is a partial cross-sectional view illustrating lead frame in a first preferred embodiment according to the invention.

Next, a lead frame in a first preferred embodiment according to the invention will be explained. The lead frame has the same structure as the conventional lead frame as shown in FIG. 1A, except that each outer lead 1 of the lead frame has a step portion 10 as shown in FIG. 2. The outer lead 1 includes a thin lead 11 which makes the step portion 10 formed by coining, for example, so that a prefabricated tip 15 is formed thereat. The dimension of tile prefabricated tip 15 is approximately two thirds of the whole thickness of tile outer lead 1 which is approximately 0.15 to 0.2 mm. while a width of the outer lead 1 is approximately 0.4 mm. Each outer lead 1 is to be cut at a line 50 after being dipped in solder, so that the prefabricated tip 15 is coated with the solder. Therefore, it is easy to connect leads obtained from the outer leads 1 with a printed circuit board on which a semiconductor device provided with the leads is mounted, as will be explained in more detail in FIGS. 4A and 4B.

Figure 3:
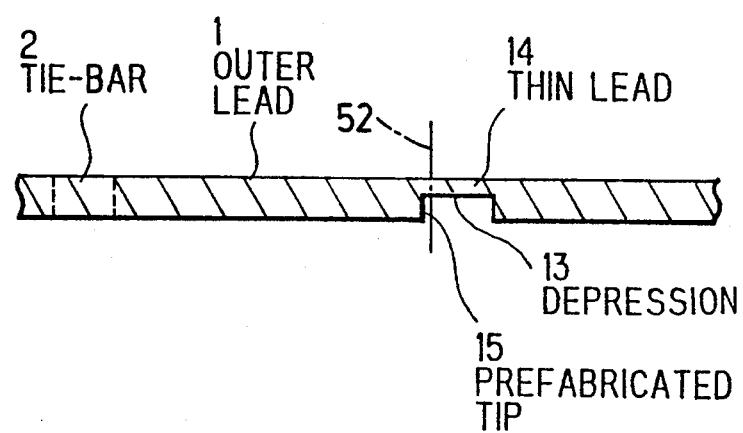
FIG. 3 is a partial cross-sectional view illustrating a lead frame in a second preferred embodiment according to the invention.

Next, a lead frame in a second preferred embodiment according to the invention will be explained. The lead frame has the same structure as the conventional lead frame as shown in FIG. 1A, except that each outer 1 lead 1 of the lead frame has a depression 13 as shown in FIG. 3. The outer lead 1 include a thin lead 14 which makes the depression 13 for example, by coining, so that a prefabricated tip 15 is formed thereat. Each outer lead 1 is to be cut at a line 52 after being dipped in solder, so that the prefabricated tip 15 is coated with the solder. Therefore, it is easy to connect leads obtained from the outer leads 1 with a board on which a semiconductor device provided with the leads is mounted, as will be explained in more detail in FIGS. 4A and 4B.

In the second preferred embodiment, the outer lead 1 remains within one plane as like the conventional lead frame, so that the lead frame can be treated in the same manner as like the conventional lead frame. Therefore, the lead frame can be fabricated by the same fabrication apparatus as like the conventional lead frame.

Figure 4A:
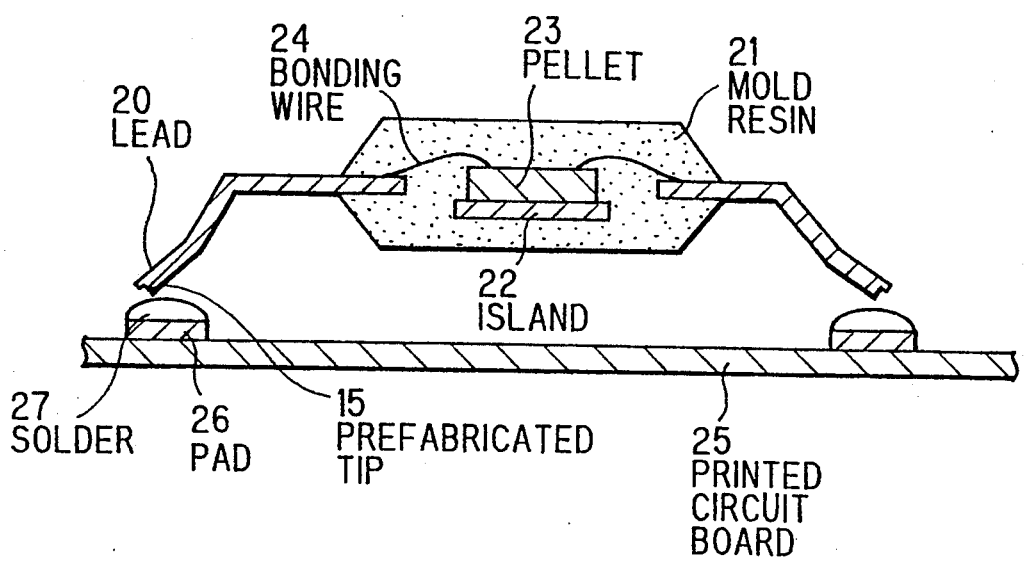
FIGS. 4A and 4B are explanatory views showing how to connect a semiconductor device using the lead frame of the first and second preferred embodiments to a pad of a printed circuit board.

FIG. 4A shows a semiconductor device having leads 20 which are obtained from the lead frame of the first and second preferred embodiments. The semiconductor device comprises a pellet mounted on a pellet 23 mounted on an island 22 of the lead frame, and leads 20 obtained from the outer and inner leads 1 and 3 of the lead frame, wherein the pellet 23 is sealed in a mold resin 21, and is connected to the lead 20 by bonding wires 24. The semiconductor device is positioned over a printed circuit board 25 having pads 26 covered with solder 27 to be mounted thereon.

Figure 4B:
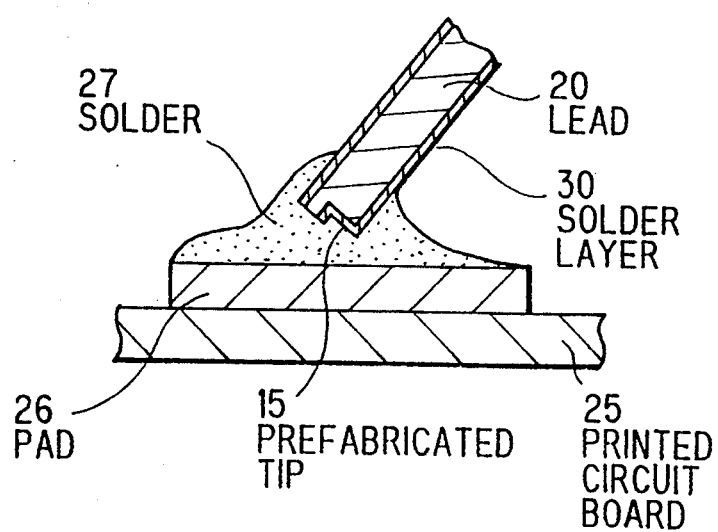

FIG. 4B shows the lead 20 having a solder layer 30 which is formed with a prefabricated tip 15, as described in FIGS. 2 and 3, that is, one of the leads 20 provided in the semiconductor device of the FIG. 4A. As illustrated in FIG. 4B, the lead 20 is connected to the pad 26 of the printed circuit board 25, such that the solder 27 of the pad 26 is soaked along the solder layer 30 coating the lead 20 including the prefabricated tip 15.

Although the invention has been described with respect to specific embodiment for complete and clear disclosure, the appended claims are not to thus limited and alternative constructions that may occur to one skilled in the art which fairly fall within the basic teaching herein set forth.

What is claimed is:

1. A lead frame for a semiconductor device, comprising:
    an island for mounting a pellet thereon;
    inner leads provided around said island and supported by tie bars of a frame member; and
    outer leads which are continuous to said inner leads by said tie bars;
    wherein each of said outer leads has a prefabricated tip with a plane vertical to a plane of said frame member, and said prefabricated tip is coated with solder, said vertical plane being formed at a boundary relative to a thin portion of said outer lead, and having a height of at least two thirds of a thickness of said outer lead.

2. A lead frame for a semiconductor device, comprising:
    an island for mounting a pellet thereon supported by a frame member, said frame member having tie bars and being of a predetermined thickness;
    inner leads provided around said island and supported by said tie bars and being of said predetermined thickness;
    outer leads which are continuous to said inner leads by said tie bars, said outer leads being of said predetermined thickness;
    wherein each of said outer leads has a prefabricated tip which is coated with solder, said prefabricated tip being defined by a plane vertical to a plane of said frame member and a thin lead being of a thickness which is less than said predetermined thickness, and said plane and said thin lead being buried within solder on a pad of a printed circuit, when said each of said outer leads is connected to said pad.

3. A lead frame for a semiconductor device, according to claim 2, wherein:
    said plane of said prefabricated tip has a height of at least two thirds of said predetermined thickness.

* * * * *